(12) United States Patent
Xiao et al.

(10) Patent No.: US 10,720,481 B2
(45) Date of Patent: Jul. 21, 2020

(54) PIXEL ARRANGEMENT STRUCTURE, ORGANIC LIGHT-EMITTING DIODE DISPLAY PANEL, FINE METAL MASK, AND DISPLAY DEVICE

(71) Applicant: BOE Technology Group Co., Ltd., Beijing (CN)

(72) Inventors: Zhihui Xiao, Beijing (CN); Yue Liu, Beijing (CN); Haohan Zhang, Beijing (CN); Shanshan Bai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 5 days.

(21) Appl. No.: 16/166,351

(22) Filed: Oct. 22, 2018

(65) Prior Publication Data
US 2019/0252469 A1   Aug. 15, 2019

(30) Foreign Application Priority Data
Feb. 9, 2018 (CN) .......................... 2018 1 0134066

(51) Int. Cl.
*H01L 27/32* (2006.01)
*G09G 3/3225* (2016.01)

(52) U.S. Cl.
CPC ......... *H01L 27/326* (2013.01); *G09G 3/3225* (2013.01); *H01L 27/3218* (2013.01); *H01L 27/3246* (2013.01); *G09G 2300/0452* (2013.01)

(58) Field of Classification Search
CPC . H01L 27/326; H01L 27/3218; G09G 3/3225; G09G 2300/0452
See application file for complete search history.

(56) References Cited

U.S. PATENT DOCUMENTS

| | | | |
|---|---|---|---|
| 2014/0071030 A1* | 3/2014 | Lee | G09G 3/3208 345/82 |
| 2016/0253943 A1* | 9/2016 | Wang | G09G 3/2003 345/694 |
| 2018/0247984 A1* | 8/2018 | Wang | H01L 27/3218 |
| 2019/0035861 A1* | 1/2019 | Wang | H01L 27/3218 |

* cited by examiner

*Primary Examiner* — Priyank J Shah
(74) *Attorney, Agent, or Firm* — Arent Fox LLP; Michael Fainberg

(57) ABSTRACT

Disclosed are a pixel arrangement structure, an organic light-emitting diode display panel, a fine metal mask, and a display device, and in the pixel arrangement structure, first sub-pixels are located at the centers of first virtual quadrilaterals, and four corners of the first virtual quadrilaterals; second sub-pixels are located at the middles of sides of the first virtual quadrilaterals; third sub-pixels are located in second virtual quadrilaterals, and four second virtual quadrilaterals constitute a first virtual quadrilateral; and in each second virtual quadrilateral, the distances between the center of a third sub-pixel, and the centers of two first sub-pixels are equal; and/or in each second virtual quadrilateral, the distances between the center of a third sub-pixel, and the centers of two second sub-pixels are equal.

13 Claims, 8 Drawing Sheets

PIXEL ARRANGEMENT STRUCTURE, ORGANIC LIGHT-EMITTING DIODE DISPLAY PANEL, FINE METAL MASK, AND DISPLAY DEVICE

CROSS-REFERENCE TO RELATED APPLICATION

This application claims priority of Chinese Patent Application No. 201810134066.8, filed on Feb. 9, 2018, which is hereby incorporated by reference in its entirety.

FIELD

The present disclosure relates to the field of display technologies, and particularly to a pixel arrangement structure, an organic light-emitting diode display panel, a fine metal mask, and a display device.

BACKGROUND

An Organic Light-Emitting Diode (OLED) display is one of focuses in the existing research field of flat panel displays, and has low power consumption, a low production cost, self-luminescence, a wide angle of view, a high response speed, and other advantages over a Liquid Crystal Display (LCD); and at present, the OLED display has come to take the place of the traditional liquid crystal display in the field of flat panel displays including a mobile phone, a PDA, a digital camera, etc.

SUMMARY

An embodiment of the disclosure provides a pixel arrangement structure including: first sub-pixels, second sub-pixels, and third sub-pixels, wherein:

the first sub-pixels are located at geometric centers of first virtual quadrilaterals, and four corners of the first virtual quadrilaterals;

the second sub-pixels are located at middles of sides of the first virtual quadrilaterals;

the third sub-pixels are located in second virtual quadrilaterals, wherein corners of each of the second virtual quadrilaterals are two second sub-pixels located at the middles of two adjacent sides of a first virtual quadrilateral, and two first sub-pixels adjacent to the two second sub-pixels, and located respectively at the geometric center of the first virtual quadrilateral, and a corner of the first virtual quadrilateral, and four second virtual quadrilaterals constitute a first virtual quadrilateral;

the pixel arrangement structure further includes at least one of following features:

in each of the second virtual quadrilaterals, distances between the geometric center of a third sub-pixel and the geometric centers of two first sub-pixels are equal; or in each of the second virtual quadrilaterals, distances between the geometric center of a third sub-pixel and the geometric centers of two second sub-pixels are equal.

In a possible implementation, in the pixel arrangement structure above according to the embodiment of the disclosure, in each of the second virtual quadrilaterals, distances between the geometric center of a third sub-pixel and the geometric centers of two second sub-pixels are unequal to distances between the geometric center of the third sub-pixel and the geometric centers of two first sub-pixels.

In a possible implementation, in the pixel arrangement structure above according to the embodiment of the disclosure, in each of second virtual quadrilaterals, two diagonal inner angles are equal to each other; and one of other two diagonal inner angles is greater than 90°, and other one of the other diagonal inner angles is less than 90°.

In a possible implementation, in the pixel arrangement structure above according to the embodiment of the disclosure, shapes of two second virtual quadrilaterals located on a diagonal of a first virtual quadrilateral are the same.

In a possible implementation, in the pixel arrangement structure above according to the embodiment of the disclosure, in a first virtual quadrilateral, four third sub-pixels are distributed in an "X" pattern.

In a possible implementation, in the pixel arrangement structure above according to the embodiment of the disclosure, in each of the second virtual quadrilaterals, a third sub-pixel is symmetric about a line connecting the geometric centers of two second sub-pixels, and the third sub-pixel is symmetric about a line connecting the geometric centers of two first sub-pixels.

In a possible implementation, in the pixel arrangement structure above according to the embodiment of the disclosure, in each of the second virtual quadrilaterals, spacings between a third sub-pixel and two first sub-pixels are equal to each other and are a first spacing, and spacings between the third sub-pixel and two second sub-pixels are equal to each other and are a second spacing, wherein the first spacing is equal to the second spacing.

In a possible implementation, in the pixel arrangement structure above according to the embodiment of the disclosure, in each of the second virtual quadrilaterals, spacings between a first sub-pixel and two second sub-pixels are equal to each other and are a third spacing, and spacings between the other first sub-pixel and the two second sub-pixels are equal to each other and are a fourth spacing, wherein the fourth spacing is greater than or equal to the third spacing, and the third spacing is greater than or equal to the first spacing.

In a possible implementation, in the pixel arrangement structure above according to the embodiment of the disclosure, shapes of the first sub-pixels, the second sub-pixels, and the third sub-pixels are polygons; or shapes of the first sub-pixels, the second sub-pixels, and the third sub-pixels are polygons with rounded corners.

In a possible implementation, in the pixel arrangement structure above according to the embodiment of the disclosure, shapes of the first sub-pixels, the second sub-pixels, and the third sub-pixels are quadrilaterals, hexagons, or octagons, or shapes of the first sub-pixels, the second sub-pixels, and the third sub-pixels are quadrilaterals with rounded corners, hexagons with rounded corners, or octagons with rounded corners.

In a possible implementation, in the pixel arrangement structure above according to the embodiment of the disclosure, the first sub-pixels are red sub-pixels, the second sub-pixels are blue sub-pixels, and the third sub-pixels are green sub-pixel; or the first sub-pixels are blue sub-pixels, the second sub-pixels are red sub-pixels, and the third sub-pixels are green sub-pixel.

In a possible implementation, in the pixel arrangement structure above according to the embodiment of the disclosure, an area of a third sub-pixel is smaller than an area of a first sub-pixel, and the area of a third sub-pixel is smaller than an area of a second sub-pixel.

In another aspect, an embodiment of the disclosure further provides an organic light-emitting diode display panel including the pixel arrangement structure above according to the embodiment of the disclosure, wherein the pixel arrangement structure according to any one of the embodiments above of the disclosure, wherein adjacent first virtual quadrilaterals are arranged in a row direction and in a column direction of the organic light-emitting diode display panel, and the adjacent first virtual quadrilaterals have a common side.

In another aspect, an embodiment of the disclosure further provides a display device including the organic light-emitting diode display panel above according to the embodiment of the disclosure.

In another aspect, an embodiment of the disclosure further provides a fine metal mask for fabricating the pixel arrangement structure above according to the embodiment of the disclosure, the fine metal mask including a plurality of opening areas corresponding in shape and position to the first sub-pixels, the second sub-pixels, or the third sub-pixels.

DETAILED DESCRIPTION OF THE EMBODIMENTS

Figure 1:
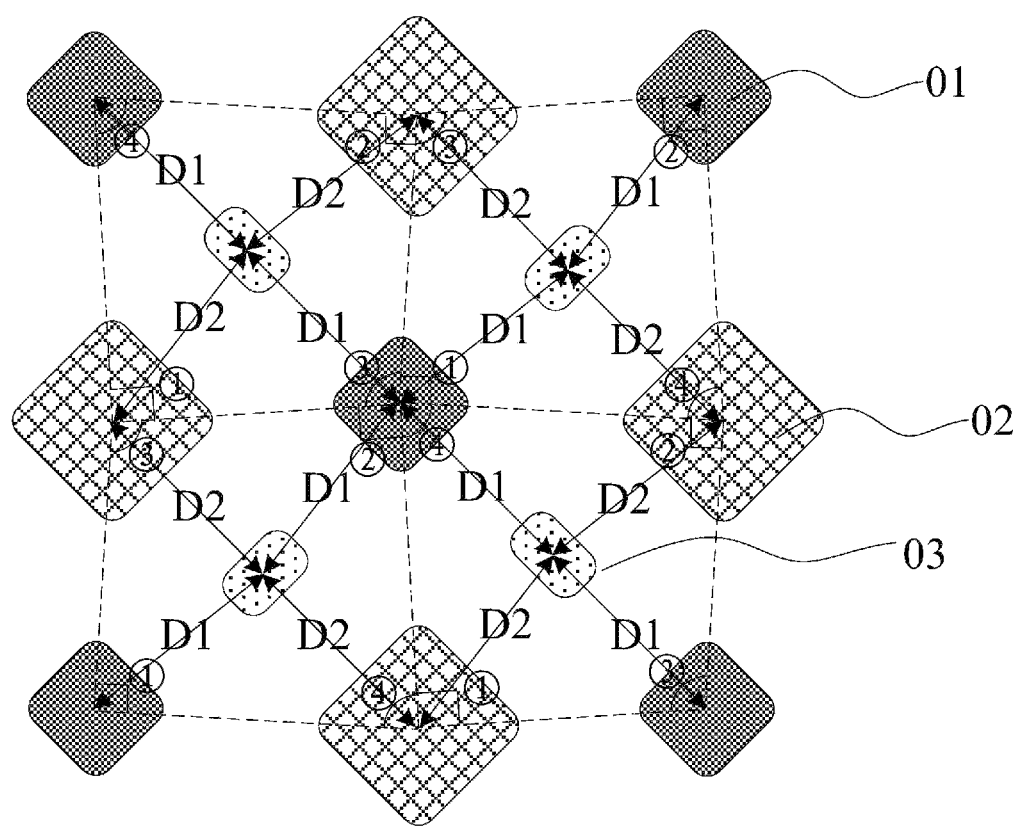
FIG. 1 is a first schematic diagram of a pixel arrangement structure according to an embodiment of the disclosure.

The structure of the OLED display generally includes an underlying substrate, and sub-pixels fabricated and arranged in a matrix on the underlying substrate, where the respective sub-pixels are typically formed as organic electroluminescent structures of an organic material at the positions of the corresponding sub-pixels on the array substrate using a fine metal mask through vapor-plating.

However, there is such a significant distance between pixels in a pixel arrangement structure in the existing OLED display that there is a small area of a pixel opening given the same resolution, so a brightness requirement on the display can be satisfied only if driving current is improved. Unfortunately the OLED elements operating at large driving current tend to age more rapidly, so their service lifetime may be shortened.

In order to make the objects, technical solutions, and advantages of the disclosure more apparent, the disclosure will be described below in further details with reference to the drawings, and apparently the embodiments described below are only a part but not all of the embodiments of the disclosure. Based upon the embodiments here of the disclosure, all the other embodiments which can occur to those ordinarily skilled in the art without any inventive effort shall fall into the scope of the disclosure.

The shapes and sizes of respective components in the drawings are not intended to reflect any real proportion, but only intended to illustrate the disclosure of the disclosure.

Figure 2:
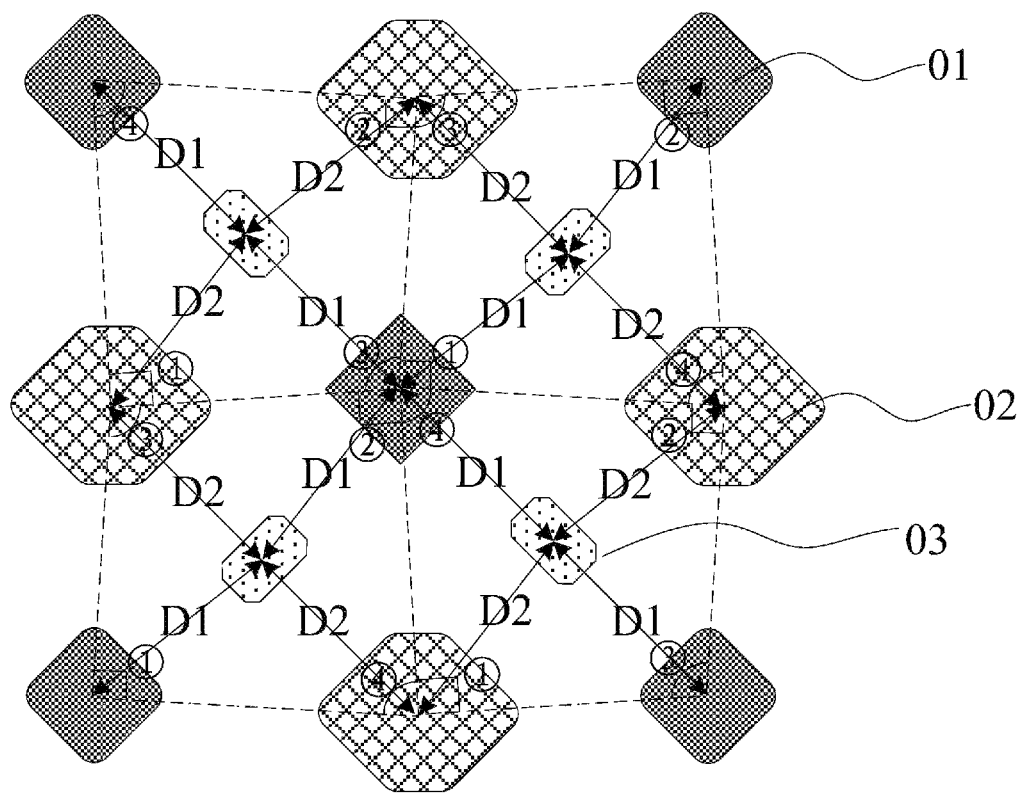
FIG. 2 is a second schematic diagram of a pixel arrangement structure according to an embodiment of the disclosure.
Figure 3:
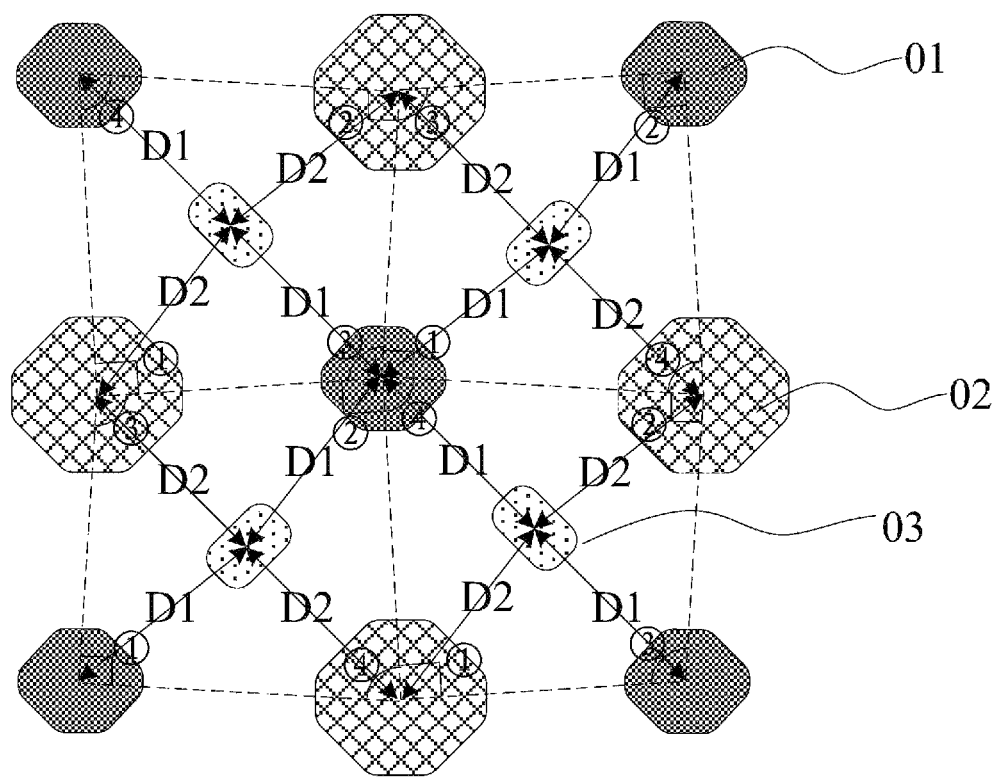
FIG. 3 is a third schematic diagram of a pixel arrangement structure according to an embodiment of the disclosure.

As illustrated in FIG. 1 to FIG. 3, a pixel arrangement structure according to an embodiment of the disclosure includes first sub-pixels 01, second sub-pixels 02, and third sub-pixels 03.

The first sub-pixels 01 are located at the geometric centers of first virtual quadrilaterals, and four corners of the first virtual quadrilaterals.

The second sub-pixels 02 are located at the middles of sides of the first virtual quadrilaterals.

The third sub-pixels 03 are located in second virtual quadrilaterals, where corners of each second virtual quadrilateral are two second sub-pixels 02 located at the middles of two adjacent sides of a first virtual quadrilateral, and first sub-pixels 01 adjacent to both of the two second sub-pixels 02, and located respectively at the center of the first virtual quadrilateral, and a corner of the first virtual quadrilateral, and four second virtual quadrilaterals constitute a first virtual quadrilateral.

In each second virtual quadrilateral, the distances D1 between the geometric center of a third sub-pixel 03, and the geometric centers of two first sub-pixels 01 are equal; and/or in each second virtual quadrilateral, the distances D2 between the geometric center of a third sub-pixel 03, and the geometric centers of two second sub-pixels 02 are equal.

Optionally, the pixel arrangement structure above according to the embodiment of the disclosure is different from the existing pixel arrangement structure in that the first sub-pixels 01, the second sub-pixels 02, and the third sub-pixels 03 can be arranged densely to thereby make the spacing between adjacent pixels as small as possible under the process condition. Furthermore, the distances between the center of a third sub-pixel 03, and the centers of two first sub-pixels 01 can be made equal in each second virtual quadrilateral to thereby further reduce the spacing between the third sub-pixel 03 and an adjacent first sub-pixel 01; and the distances between the center of the third sub-pixel 03, and the centers of two second sub-pixels 02 can be made equal in each second virtual quadrilateral to thereby further reduce the spacing between the third sub-pixel 03 and an adjacent second sub-pixel 02, so that the area of a pixel opening can be increased at the same resolution, and driving current of a display element can be lowered to thereby prolong the service lifetime thereof.

It shall be noted that in the pixel arrangement structure above according to the embodiment of the disclosure, the position of a pixel refers to a positional range of the pixel as long as the pixel overlaps with the pixel. In an optional implementation, the geometric center of the pixel may overlap with the position, or the geometric center of the pixel may not overlap with the position, that is, there may be an offset between them, although the embodiment of the disclosure will not be limited thereto. Furthermore, the geometric center of the pixel may be the geometric center of a pattern of the pixel, or may be the geometric center of a color of light emitted by the pixel, although the embodiment of the disclosure will not be limited thereto.

Optionally, in the pixel arrangement structure above according to the embodiment of the disclosure, in order to enable respective pixels to be distributed uniformly, the geometric centers of the respective pixels are made as proximate as possible to their corresponding positions.

It shall be noted that a first virtual quadrilateral as referred to in the pixel arrangement structure above according to the embodiment of the disclosure is the biggest dotted box in FIG. 1, and a second virtual quadrilateral is the smaller dotted box in FIG. 1; and in FIG. 1, the first virtual quadrilateral includes four second virtual quadrilaterals, and the first virtual quadrilateral and the second virtual quadrilateral can be rectangles, squares, or quadrilaterals like a rectangle and a square, although the embodiment of the disclosure will not be limited thereto.

Optionally, in the pixel arrangement structure above according to the embodiment of the disclosure, as illustrated in FIG. 1 to FIG. 3, in each second virtual quadrilateral, the distances D2 between the geometric center of a third sub-pixel 03, and the geometric centers of two second sub-pixels 02 are not equal to the distances D1 between the geometric center of the third sub-pixel 03, and the geometric centers of two first sub-pixels 01.

Optionally, the distance between the center of a third sub-pixel 03, and the center of a first sub-pixel 01 (a second sub-pixel 02) can be adjusted in each second virtual quadrilateral so that the first sub-pixels 01, the second sub-pixels 02, and the third sub-pixels 03 are arranged densely under the process condition to thereby make the spacing between adjacent pixels as small as possible, so that the area of a pixel opening can be increased at the same resolution, and driving current of a display element can be lowered to thereby prolong the service lifetime thereof.

Optionally, in the pixel arrangement structure above according to the embodiment of the disclosure, as illustrated in FIG. 1 to FIG. 3, in each second virtual quadrilateral, two diagonal inner angles are equal to 90°, i.e., ①=②=90°; and one of the other two diagonal inner angles is greater than 90°, i.e., ③>90°, and the other is less than 90°, i.e., ④<90°, i.e., ③+④=180°.

Optionally, each second virtual quadrilateral is another pattern than a rectangle, and the first sub-pixels 01, the second sub-pixels 02, and the third sub-pixels 03 can be arranged densely under the same process condition to thereby make the spacing between adjacent pixels as small as possible, so that the area of a pixel opening can be increased at the same resolution, and driving current of a display element can be lowered to thereby prolong the service lifetime thereof.

Optionally, in the pixel arrangement structure above according to the embodiment of the disclosure, as illustrated in FIG. 1 to FIG. 3, the shapes of two second virtual quadrilaterals located on a diagonal of a first virtual quadrilateral are the same, that is, the shape of the second virtual quadrilateral at the top-left corner is the same as the shape of the second virtual quadrilateral at the bottom-right corner, and the shape of the second virtual quadrilateral at the top-right corner is the same as the shape of the second virtual quadrilateral at the bottom-left corner. The shapes of two second virtual quadrilaterals located on a diagonal are set the same to thereby make the spacing between adjacent pixels as small as possible, and the first sub-pixels 01, the second sub-pixels 02, and the third sub-pixels 03 can be arranged densely under the same process condition to thereby make the spacing between adjacent pixels as small as possible, so that the area of a pixel opening can be increased at the same resolution, and driving current of a display element can be lowered to thereby prolong the service lifetime thereof.

Figure 4:
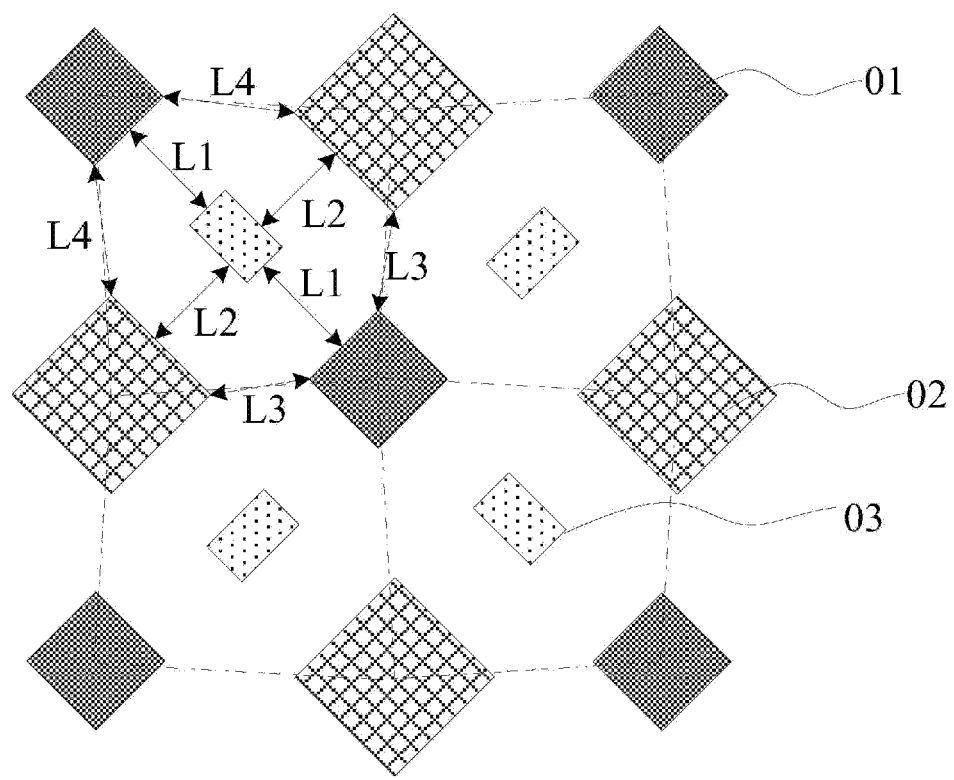
FIG. 4 is a fourth schematic diagram of a pixel arrangement structure according to an embodiment of the disclosure.
Figure 5:
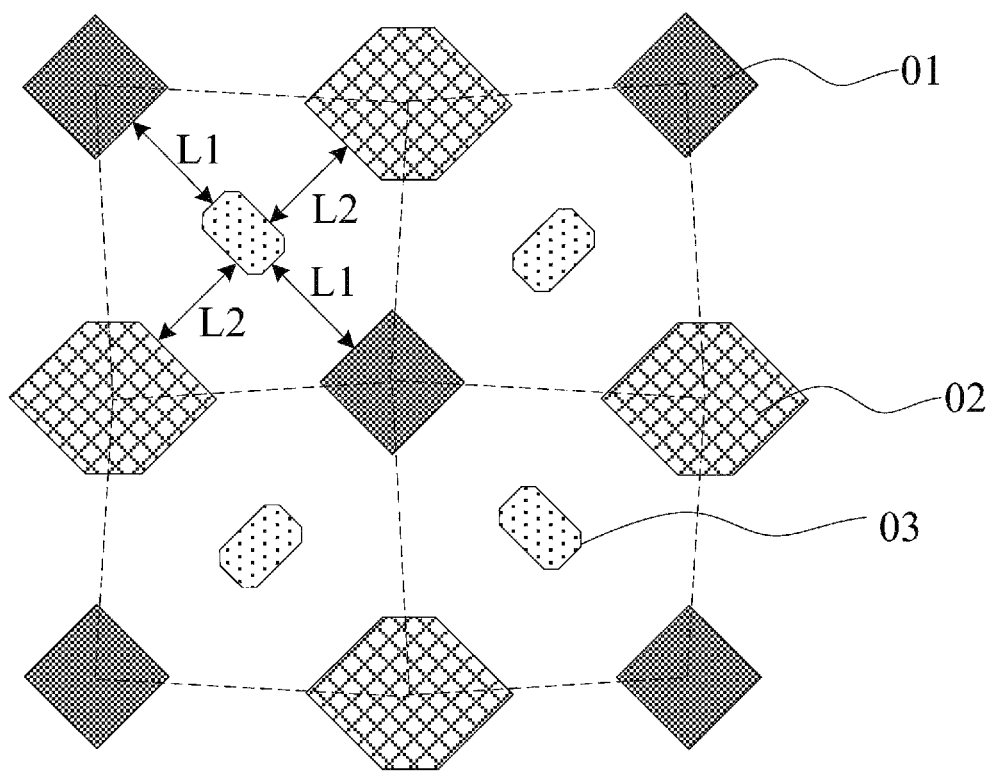
FIG. 5 is a fifth schematic diagram of a pixel arrangement structure according to an embodiment of the disclosure.
Figure 6:
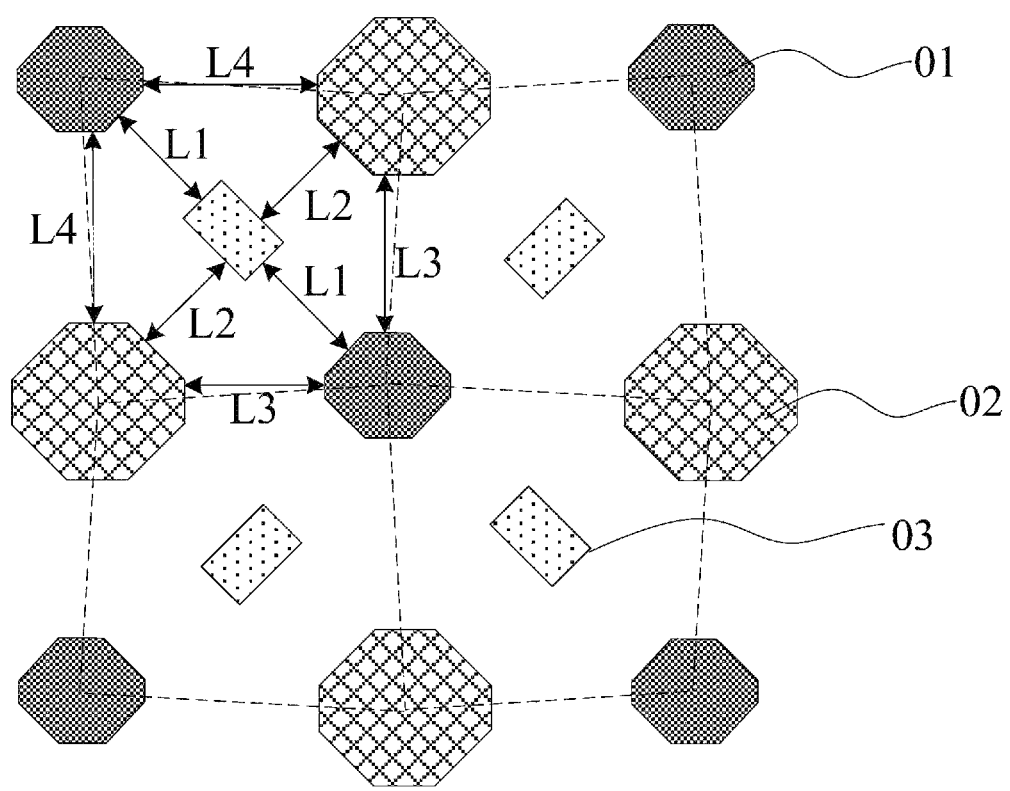
FIG. 6 is a sixth schematic diagram of a pixel arrangement structure according to an embodiment of the disclosure.

Optionally, in the pixel arrangement structure above according to the embodiment of the disclosure, as illustrated in FIG. 4 to FIG. 6, in each second virtual quadrilateral, the spacings between a third sub-pixel 03 and two first sub-pixels 01 are equal to a first spacing L1, and the spacings between the third sub-pixel 03 and two second sub-pixels 02 are equal to a second spacing L2, where the first spacing L1 is equal to the second spacing L2. The spacing between the third sub-pixel 03 and a first sub-pixel 01 (or a second sub-pixel 02) is made as small as possible, so that the area of a pixel opening can be increased at the same resolution, and driving current of a display element can be lowered to thereby prolong the service lifetime thereof.

It shall be noted that the smallest spacing between sub-pixels as referred to in the pixel arrangement structure above according to the embodiment of the disclosure refers to the shortest distance between proximate edges of the sub-pixels, where the distance is shorter than a distance between the geometric centers of two sub-pixels.

Optionally, in the pixel arrangement structure above according to the embodiment of the disclosure, the spacing between a third sub-pixel 03 and an adjacent first sub-pixel 01 shall be greater than or equal to a process limit distance, and the spacing between a third sub-pixel 03 and an adjacent second sub-pixel 02 shall be greater than or equal to the process limit distance, thus satisfying a process demand. Furthermore the spacing is generally the process limit distance, and a range of values of the spacing is generally dependent upon a fabrication process in use, where when a pixel is patterned in an etching process using a Fine Metal Mask (FMM), the smallest spacing is approximately 16 μm, and when a pixel is patterned in a laser, electroforming, etc., process, the spacing is smaller.

Optionally, in the pixel arrangement structure above according to the embodiment of the disclosure, as illustrated in FIG. 4 and FIG. 6, in each second virtual quadrilateral, the spacings between a first sub-pixel 01 and two second sub-pixels 02 are equal to a third spacing L3, and the spacings between the other first sub-pixel 01 and the two second sub-pixels 02 are equal to a fourth spacing L4, where the fourth spacing L4 is greater than or equal to the third spacing L3, and the third spacing L3 is greater than or equal to the first spacing L1. The spacing between a first sub-pixel 01 and a second sub-pixel 02 is made as small as possible, so that the area of a pixel opening can be increased at the same resolution, and driving current of a display element can be lowered to thereby prolong the service lifetime thereof.

Optionally, in the pixel arrangement structure above according to the embodiment of the disclosure, as illustrated in FIG. 4 to FIG. 6, the shapes of the first sub-pixels 01, the second sub-pixels 02, and the third sub-pixels 03 can be polygons; or as illustrated in FIG. 1 to FIG. 3, the shapes of the first sub-pixels 01, the second sub-pixels 02, and the third sub-pixels 03 can be polygons with rounded corners.

Optionally, in the pixel arrangement structure above according to the embodiment of the disclosure, as illustrated in FIG. 1 to FIG. 6, the shapes of the first sub-pixels 01, the second sub-pixels 02, and the third sub-pixels 03 are quadrilaterals, hexagons, octagons, quadrilaterals with rounded corners, hexagons with rounded corners, or octagons with rounded corners.

Optionally, FIG. 1 illustrates the first sub-pixels 01, the second sub-pixels 02, and the third sub-pixels 03, the shapes of which are quadrilaterals with rounded corners. FIG. 2 illustrates the first sub-pixels 01, the shapes of which are quadrilaterals with rounded corners, the second sub-pixels 02, the shapes of which are hexagons with rounded corners, and the third sub-pixels 03, the shapes of which are octagons with rounded corners. FIG. 3 illustrates the first sub-pixels 01 and the second sub-pixels 02, the shapes of which are octagons with rounded corners, and the third sub-pixels 03, the shapes of which are quadrilaterals with rounded corners. FIG. 4 illustrates the first sub-pixels 01, the second sub-pixels 02, and the third sub-pixels 03, the shapes of which are quadrilaterals. FIG. 5 illustrates the first sub-pixels 01, the shapes of which are quadrilaterals, the second sub-pixels 02, the shapes of which are hexagons, and the third sub-pixels 03, the shapes of which are octagons. FIG. 6 illustrates the first sub-pixels 01 and the second sub-pixels 02, the shapes of which are octagons, and the third sub-pixels 03, the shapes of which are quadrilaterals. The shapes of the first sub-pixels 01, the second sub-pixels 02, and the third sub-pixels 03 have only been described above by way of an example, but will not be limited thereto in a real application.

Optionally, in the pixel arrangement structure above according to the embodiment of the disclosure, in each second virtual quadrilateral, a third sub-pixel 03 can be symmetric about a line connecting the geometric centers of two second sub-pixels 02, and the third sub-pixel 03 can be symmetric about a line connecting the geometric centers of two first sub-pixels 01.

In order to enable the same kind of pixels to be fabricated using a uniform mask pattern to thereby simplify a patterning process thereof, optionally in the pixel arrangement structure above according to the embodiment of the disclosure, as illustrated in FIG. 1 to FIG. 7, the shapes of the respective first sub-pixels 01 can be the same, the shapes of the respective second sub-pixels 02 can be the same, and the shapes of the respective third sub-pixels 03 can be the same.

Optionally, in the pixel arrangement structure above according to the embodiment of the disclosure, the shapes of at least two first sub-pixels 01 can be different, the shapes of at least two second sub-pixels 02 can be different, and the shapes of at least two third first sub-pixels 03 can be different, although the embodiment of the disclosure will not be limited thereto.

Optionally, in the pixel arrangement structure above according to the embodiment of the disclosure, in a first virtual quadrilateral, when the patterns of four third sub-pixels 03 are the same or similar, they can be arranged at different angles, or as illustrated in FIG. 1 to FIG. 7, in a first virtual quadrilateral, four third sub-pixels 03 can be distributed in an "X" pattern, that is, the four third sub-pixels 03 are strip-shaped, and refer to the center of the first virtual quadrilateral in the length direction of the strip; or the patterns of four third sub-pixels 03 can be rotated at any angle, although the embodiment of the disclosure will not be limited thereto.

Optionally, the particular shapes, positional relationship, parallelism, angle relationship, etc., of the first sub-pixels 01, the second sub-pixels 02, and the third sub-pixels 03 can be designed as needed, and in a real process, there may be some error due to a limiting process condition or another factor, so the shapes, positions, and relative positional relationship of the respective sub-pixels in the pixel arrangement structure according to the embodiment of the disclosure may roughly satisfy the condition above without departing the scope of the disclosure.

Figure 7:
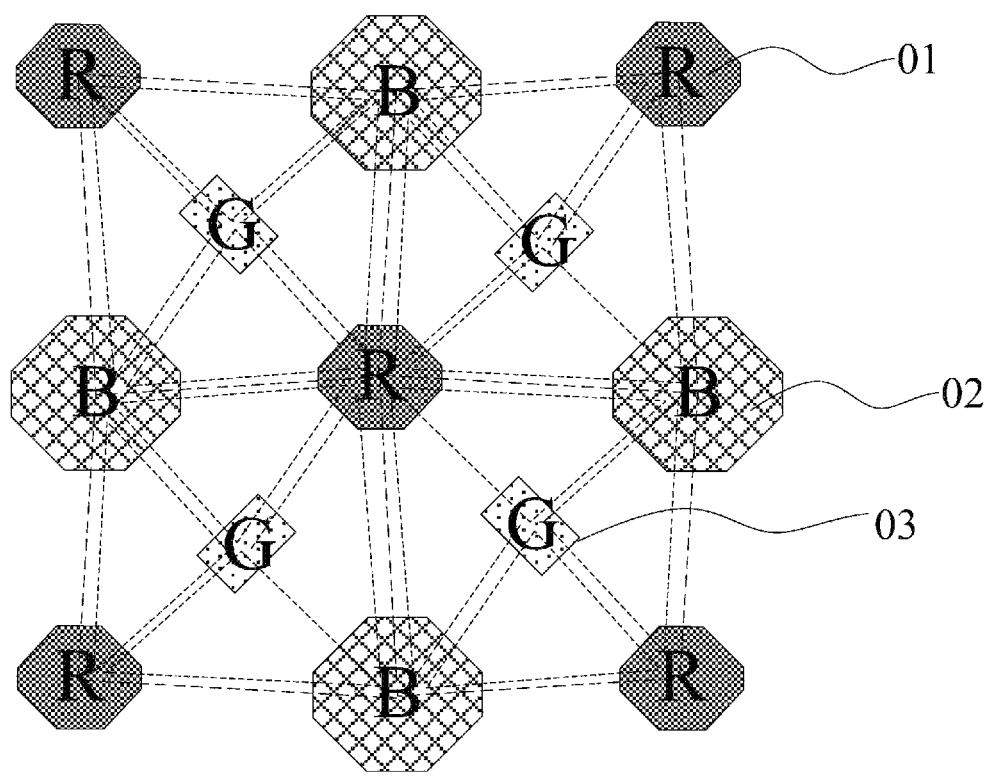
FIG. 7 is a seventh schematic diagram of a pixel arrangement structure according to an embodiment of the disclosure.

Optionally, in the pixel arrangement structure according to the embodiment of the disclosure, the first sub-pixels 01 can be red sub-pixels, and the second sub-pixels 02 can be blue sub-pixels, or the first sub-pixels 01 can be blue sub-pixels, and the second sub-pixels 02 can be red sub-pixels; and the third sub-pixels 03 can be green sub-pixels, so that as illustrated in FIG. 7, a green sub-pixel G located in a red virtual quadrilateral together with a red sub-pixel R and a green sub-pixel B located at any two adjacent corners of the second virtual quadrilateral can constitute a light-emitting pixel.

Furthermore, since human eyes are sensitive to green light, optionally in the pixel arrangement structure above according to the embodiment of the disclosure, as illustrated in FIG. 1 to FIG. 7, the area of a third sub-pixel 03 can be smaller than the area of a first sub-pixel 01, and the area of a third sub-pixel 03 can be smaller than the area of a second sub-pixel 02, that is, the area of a green sub-pixel is smaller than the area of a red sub-pixel, and the area of a green sub-pixel is smaller than the area of a blue sub-pixel, that is, the area of a green sub-pixel is the smallest.

Optionally, in the pixel arrangement structure above according to the embodiment of the disclosure, the area of a second sub-pixel 02 may be the same as the area of a first sub-pixel 01, that is, the area of a red sub-pixel may the same as the area of a blue sub-pixel; or the area of a second sub-pixel 02 may be different from the area of a first sub-pixel 01, that is, the area of a red sub-pixel may be different from the area of a blue sub-pixel, although the embodiment of the disclosure will not be limited thereto. Generally the efficiency of light emission by and the service lifetime of a blue sub-pixel are lower and shorter than those of a red sub-pixel, so the area of a blue sub-pixel can be set larger than the area of a red sub-pixel as illustrated in FIG. 7.

Figure 8:
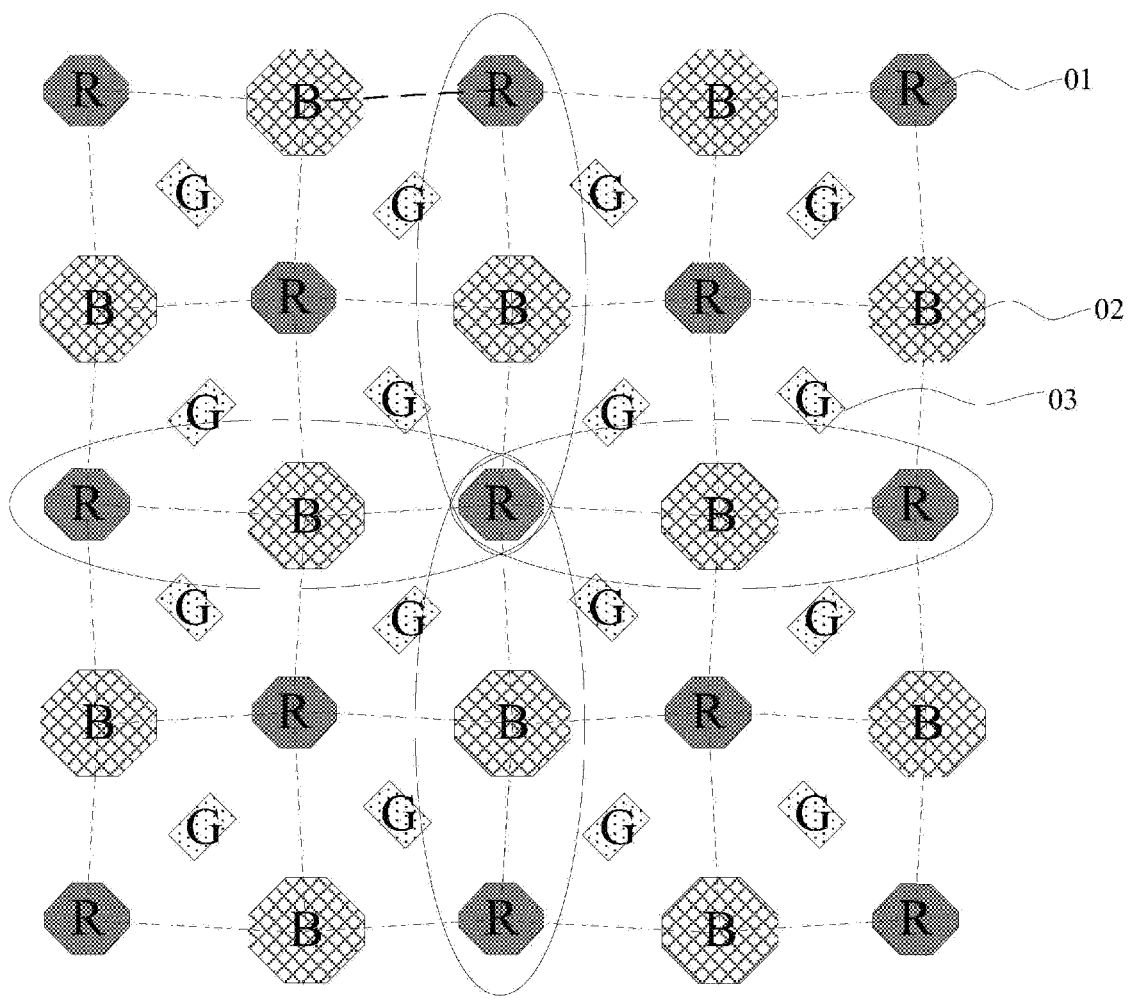
FIG. 8 is a schematic structural diagram of an organic light-emitting diode display panel according to an embodiment of the disclosure.

Based upon the same inventive idea, an embodiment of the disclosure further provides an organic light-emitting diode display panel as illustrated in FIG. 8 including a plurality of densely arranged pixel arrangement structures (e.g., four pixel arrangement structures as illustrated in FIG. 8), each of which is the pixel arrangement structures according to any one of the embodiments above of the disclosure, where adjacent first virtual quadrilaterals are arranged in the row direction and in the column direction with one of their sides being common. That is, two adjacent pixel arrangement structures share first sub-pixels 01 and a second sub-pixel 02 located on the common side of the adjacent first virtual quadrilaterals, and for example, three pixels circled in each ellipse as illustrated in FIG. 8 are pixels shared by two adjacent pixel arrangement structures. Since the organic light-emitting diode display panel addresses the problem under a similar principle to the pixel arrangement structure above, reference can be made to the implementation of the pixel arrangement structure above for an implementation of the organic light-emitting diode display panel, and a repeated description thereof will be omitted here.

Optionally, in the organic light-emitting diode display panel according to the embodiment of the disclosure, as illustrated in FIG. 8, the first sub-pixels 01 and the second sub-pixels 02 are arranged alternately in the row direction, the first sub-pixels 01 and the second sub-pixels 02 are also arranged alternately in the column direction, and the third sub-pixels 03 are located in respective second virtual quadrilaterals defined by two first sub-pixels 01 and two second sub-pixels 02, so that while an image is being displayed, any two adjacent first sub-pixel 01 and second sub-pixel 02 together with one third sub-pixel 03 adjacent thereto can constitute a light-emitting pixel, so that the image can be displayed at a high resolution using a physical low resolution through borrowing between the sub-pixels.

Based upon the same inventive idea, an embodiment of the disclosure further provides a fine metal mask for fabricating the pixel arrangement structure above according to any one of the embodiments above of the disclosure, where the fine metal mask includes a plurality of opening areas corresponding in shape and position to the first sub-pixels, the second sub-pixels, or the third sub-pixels.

Based upon the same inventive idea, an embodiment of the disclosure further provides a display device including the organic light-emitting diode display panel according to the embodiment above of the disclosure. The display device can be a mobile phone, a tablet computer, a TV set, a monitor, a notebook computer, a digital photo frame, a navigator, or any other product or component with a display function. Reference can be made to the embodiment of the organic light-emitting diode display panel above for an implementation of the display device, and a repeated description thereof will be omitted here.

With the pixel arrangement structure, the organic light-emitting diode display panel, the fine metal mask, and the display device above according to the embodiments of the disclosure, in the pixel arrangement structure, the first sub-pixels are located at the geometric centers of first virtual quadrilaterals, and four corners of the first virtual quadrilaterals; the second sub-pixels are located at the middles of sides of the first virtual quadrilaterals; the third sub-pixels are located in second virtual quadrilaterals, where corners of each second virtual quadrilateral are two second sub-pixels located at the middles of two adjacent sides of a first virtual quadrilateral, and first sub-pixels adjacent to both of the two second sub-pixels, and located respectively at the geometric center of the first virtual quadrilateral, and a corner of the first virtual quadrilateral, and four second virtual quadrilaterals constitute a first virtual quadrilateral; and in each second virtual quadrilateral, the distances between the geometric center of a third sub-pixel, and the geometric centers of two first sub-pixels are equal; and/or in each second virtual quadrilateral, the distances between the geometric center of a third sub-pixel, and the geometric centers of two second sub-pixels are equal. This pixel arrangement structure is different from the existing pixel arrangement structure in that the first sub-pixels, the second sub-pixels, and the third sub-pixels can be arranged densely to thereby make the spacing between adjacent pixels as small as possible under the process condition, so that the area of a pixel opening can be increased at the same resolution, and driving current of a display element can be lowered to thereby prolong the service lifetime thereof.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A pixel arrangement structure, comprising: first sub-pixels, second sub-pixels, and third sub-pixels, wherein:
the first sub-pixels are located at geometric centers of first virtual quadrilaterals, and four corners of the first virtual quadrilaterals;
the second sub-pixels are located at middles of sides of the first virtual quadrilaterals;
the third sub-pixels are located in second virtual quadrilaterals, wherein corners of each of the second virtual quadrilateral are two second sub-pixels located at the middles of two adjacent sides of a first virtual quadrilateral, and two first sub-pixels adjacent to the two second sub-pixels, and located respectively at a geometric center of the first virtual quadrilateral and a corner of the first virtual quadrilateral, and four second virtual quadrilaterals constitute a first virtual quadrilateral; and the pixel arrangement structure further comprises at least one of following features:
in each of the second virtual quadrilaterals, distances between the geometric center of a third sub-pixel and the geometric centers of two first sub-pixels are equal; or
in each of the second virtual quadrilateral, distances between the geometric center of a third sub-pixel and the geometric centers of two second sub-pixels are equal;
wherein in each of second virtual quadrilaterals, the distances between the geometric center of a third sub-pixel and the geometric centers of two second sub-pixels are unequal to the distances between the geometric center of the third sub-pixel and the geometric centers of two first sub-pixels;
wherein in each of the second virtual quadrilaterals, two diagonal inner angles are equal to each other; and one of other two diagonal inner angles is greater than 90°, and other one of the other two diagonal inner angles is less than 90°.

2. The pixel arrangement structure according to claim 1, wherein shapes of two second virtual quadrilaterals located on a diagonal of a first virtual quadrilateral are same.

3. The pixel arrangement structure according to claim 2, wherein in a first virtual quadrilateral, four third sub-pixels are distributed in an "X" pattern.

4. The pixel arrangement structure according to claim 1, wherein in each of the second virtual quadrilaterals, a third sub-pixel is symmetric about a line connecting the geometric centers of two second sub-pixels, and the third sub-pixel is symmetric about a line connecting the geometric centers of two first sub-pixels.

5. The pixel arrangement structure according to claim 4, wherein in each of the second virtual quadrilaterals, spacings between a third sub-pixel and two first sub-pixels are equal to each other and are a first spacing, and spacings between the third sub-pixel and two second sub-pixels are equal to each other and are a second spacing, wherein the first spacing is equal to the second spacing.

6. The pixel arrangement structure according to claim 5, wherein in each of the second virtual quadrilaterals, spacings between a first sub-pixel and two second sub-pixels are equal to each other and are a third spacing, and spacings between other first sub-pixel and the two second sub-pixels are equal to each other and are a fourth spacing, wherein the fourth spacing is greater than or equal to the third spacing, and the third spacing is greater than or equal to the first spacing.

7. The pixel arrangement structure according to claim 1, wherein the shapes of the first sub-pixels, the second sub-pixels, and the third sub-pixels are polygons; or the shapes of the first sub-pixels, the second sub-pixels, and the third sub-pixels are polygons with rounded corners.

8. The pixel arrangement structure according to claim 7, wherein shapes of the first sub-pixels, the second sub-pixels, and the third sub-pixels are quadrilaterals, hexagons, or octagons, or
shapes of the first sub-pixels, the second sub-pixels, and the third sub-pixels are quadrilaterals with rounded corners, hexagons with rounded corners, or octagons with rounded corners.

9. The pixel arrangement structure according to claim 1, wherein the first sub-pixels are red sub-pixels, the second sub-pixels are blue sub-pixels, and the third sub-pixels are green sub-pixels, or the first sub-pixels are blue sub-pixels, the second sub-pixels are red sub-pixels and the third sub-pixels are green sub-pixels.

10. The pixel arrangement structure according to claim 9, wherein an area of a third sub-pixel is smaller than an area of a first sub-pixel, and the area of a third sub-pixel is smaller than an area of a second sub-pixel.

11. An organic light-emitting diode display panel, comprising the pixel arrangement structure according to claim 1, wherein adjacent first virtual quadrilaterals are arranged in a row direction and in a column direction of the organic light-emitting diode display panel, and the adjacent first virtual quadrilaterals have a common side.

12. A display device, comprising the organic light-emitting diode display panel according to claim 11.

13. A fine metal mask for fabricating the pixel arrangement structure according to claim 1, the fine metal mask comprising a plurality of opening areas corresponding in shape and position to the first sub-pixels, the second sub-pixels, or the third sub-pixels.

* * * * *